(12) United States Patent
Mita

(10) Patent No.: US 6,753,533 B2
(45) Date of Patent: Jun. 22, 2004

(54) ELECTRON BEAM APPARATUS AND METHOD OF CONTROLLING SAME

(75) Inventor: Masaaki Mita, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/287,431

(22) Filed: Nov. 4, 2002

(65) Prior Publication Data

US 2004/0084628 A1 May 6, 2004

(51) Int. Cl.[7] .............................................. H01J 31/256
(52) U.S. Cl. .................. 250/396 R; 250/311; 250/310; 313/363.1
(58) Field of Search ............................. 250/396 R, 311, 250/310, 323 F; 313/363.1

(56) References Cited

U.S. PATENT DOCUMENTS 5,235,188 A * 8/1993 Mul ........................... 250/311
5,389,787 A * 2/1995 Todokoro et al. ........... 250/310

FOREIGN PATENT DOCUMENTS

JP         07294463         11/1995

OTHER PUBLICATIONS

Todokoro et al. "Scanning Electron Micorcope", Pub. No: US 2003/0127604 A1, publication date: Jul. 10, 2003.*

* cited by examiner

Primary Examiner—John R. Lee
Assistant Examiner—Zia R. Hashmi
(74) Attorney, Agent, or Firm—Webb Ziesenheim Logsdon Orkin & Hanson, P.C.

(57) ABSTRACT

An electron beam apparatus is offered which is capable of being used optimally over a wide range of electron beam currents. A method of controlling this apparatus is also offered. The apparatus has an electron emitter for producing an electron beam. The beam is collimated or slightly converged (made a real-image mode beam) by the first condenser lens. As a result, the amount of the electron beam limited by the anode electrode can be reduced to a minimum. The excitation of the first condenser lens is fixed to parallel beam conditions and so movement of the virtual electron source is prevented. This can enhance the axial accuracy.

7 Claims, 5 Drawing Sheets

ELECTRON BEAM APPARATUS AND METHOD OF CONTROLLING SAME

BACKGROUND OF THE INVENTION

1. Field of the Invention

The present invention relates to an electron beam apparatus, such as a scanning electron microscope, electron probe microanalyzer, or Auger spectrometer using a field emission gun as its electron beam source. The invention also relates to a method of controlling such an electron beam apparatus.

2. Description of Related Art

In a scanning electron microscope, an electron beam is sharply focused onto a specimen. A desired range on the specimen is scanned with the beam. The electron beam irradiation of the specimen produces secondary electrons, which are detected. The resulting signal is supplied to a display, such as a CRT synchronized with the scanning of the primary electron beam. In this way, a scanned image of the specimen is displayed.

In an electron probe microanalyzer, an electron beam is directed at a specimen. Characteristic X-rays emanating from the specimen are detected. In an Auger spectrometer, Auger electrons from a specimen surface are detected, and their energies are measured.

In these various kinds of electron beam apparatus, field emission guns using a wide range of emission currents have been recently used as electron beam sources. In an electron beam apparatus, such as a scanning electron microscope, electron probe microanalyzer, or Auger spectrometer, the emission current needs to be varied over a wide range from the order of pico-amperes to hundreds of nano-amperes.

In order to collect the on-axis electron beam efficiently with a field emission gun using a small amount of total emission current, the first condenser lens is preferably mounted above the anode electrode aperture. It is known that in an electron beam apparatus fitted with a field emission gun (FEG), the resolution at high electron beam (probe) currents of more than nano-amperes deteriorates dependently on the angular current density of the field emission electron source and on the spherical aberration coefficient of the first condenser lens.

Furthermore, the angular current density is determined by the field emission electron source. Therefore, it is necessary to improve the spherical aberration coefficient of the first condenser lens in order to improve the resolution at high electron beam currents. For this reason, in an electron optical system using the conventional two-stage condenser lens system, the amount of electron beam current is controlled by the first condenser lens. The angular aperture conditions are optimized with the second condenser lens.

Where the first condenser lens is placed close to the field emission emitter, the distance between the principal plane of the first condenser lens and the object point is too small. Therefore, it is difficult to use the first condenser lens in the real image mode. Consequently, in the conventional first condenser lens, the electron beam current has been continuously controlled in the virtual image mode. In this case, the aberration coefficient of the first condenser lens determining the resolution at high electron beam currents cannot be taken into consideration. In addition, where the first condenser lens is placed close to the emitter and the apparatus is used in the virtual image mode, even if a two-stage condenser lens system is used, limitations are imposed on the variable range of the electron beam current.

SUMMARY OF THE INVENTION

It is an object of the present invention to provide an electron beam apparatus that can be used optimally at any electron beam current.

It is another object of the present invention to provide a method of controlling this electron beam apparatus.

An electron beam apparatus according to the present invention comprises: (a) a field emission gun having a field emission emitter, an extraction electrode for extracting electrons from the emitter to thereby extract an electron beam, and an anode electrode for accelerating the electron beam emitted from the emitter; (b) a first condenser lens for collimating the electron beam extracted by the extraction electrode; (c) a second condenser lens mounted behind the anode electrode; (d) an angular aperture control lens; and (e) an objective lens for focusing the electron beam onto a specimen. The electron beam is collimated or made a real-image mode beam by the first condenser lens.

The present invention also provides a method for controlling an electron beam apparatus having (a) a field emission gun having a field emission emitter, an extraction electrode for extracting electrons from the emitter to thereby extract an electron beam, and an anode electrode for accelerating the electron beam emitted from the emitter; (b) a first condenser lens for collimating the electron beam extracted by the extraction electrode; (c) a second condenser lens mounted behind the anode electrode; (d) an angular aperture control lens; and (e) an objective lens for focusing the electron beam onto a specimen. The method consists of collimating the electron beam or making the beam a real-image mode beam by the first condenser lens.

Other objects and features of the invention will appear in the course of the description thereof, which follows.

DESCRIPTION OF THE PREFERRED EMBODIMENTS

Figure 1A:
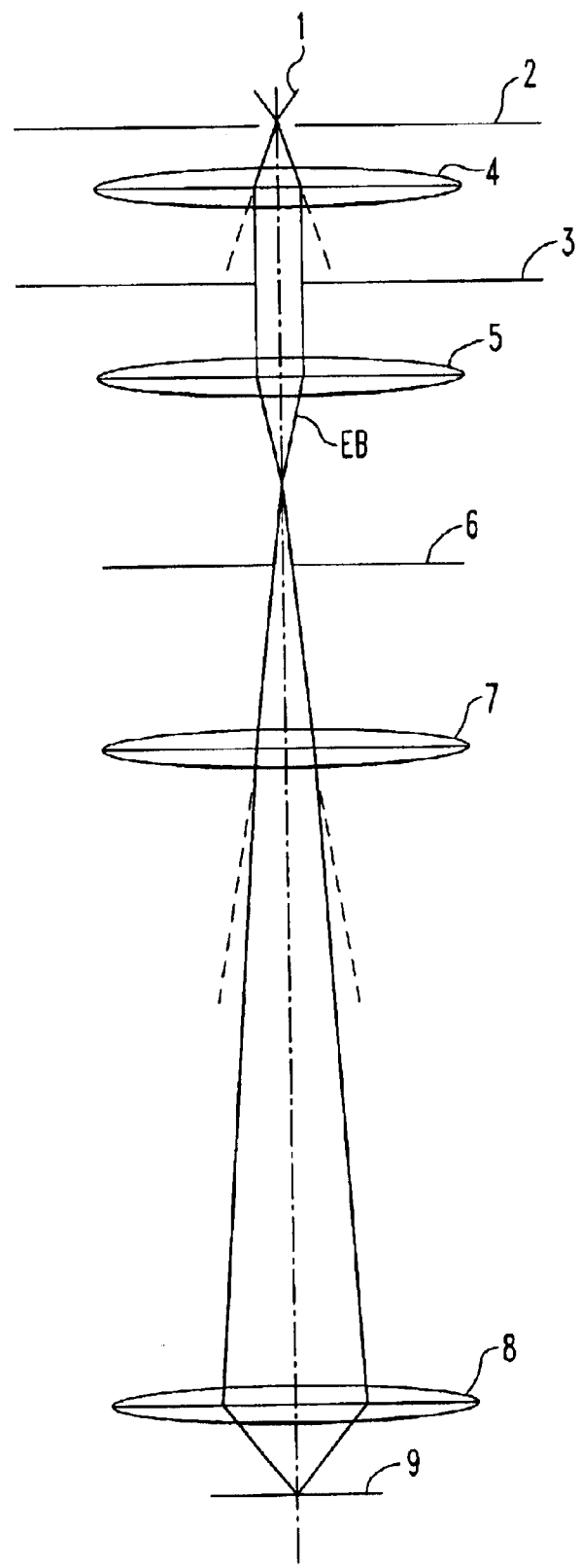
FIG. 1(a) is a ray diagram of an electron beam apparatus according to the present invention at high electron beam currents.
Figure 2:
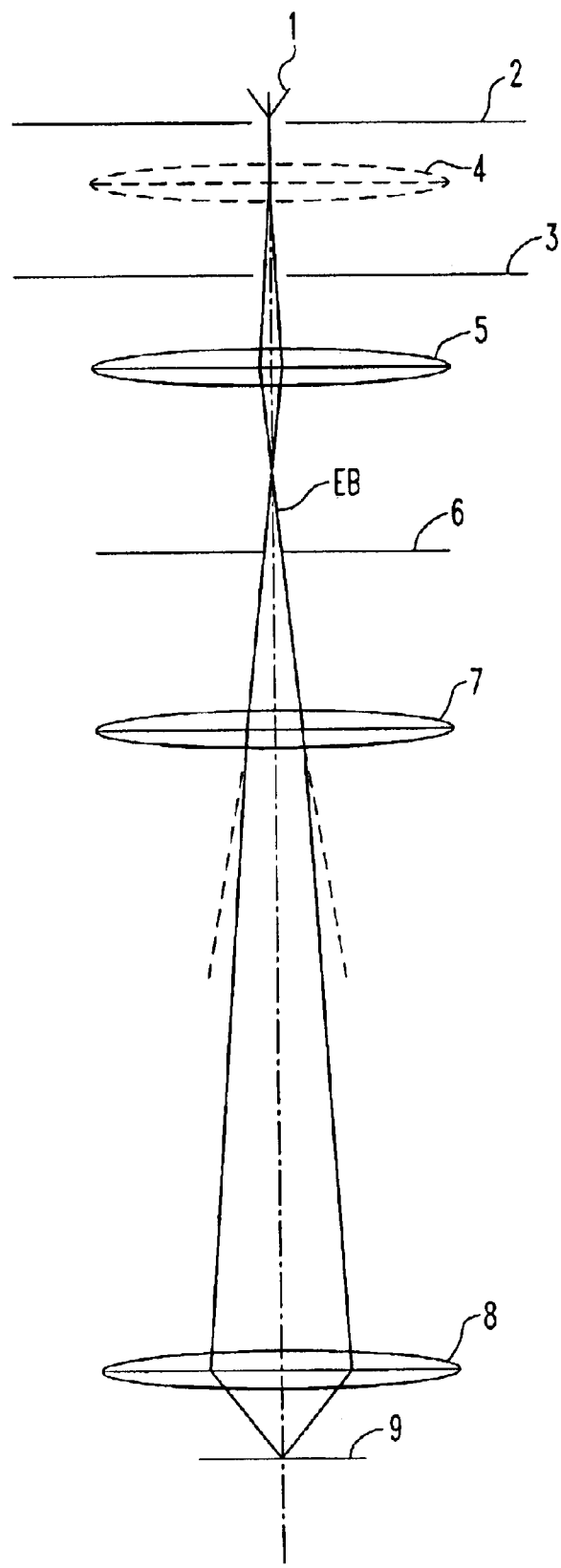
FIG. 2 is a ray diagram similar to FIG. 1(a), but at quite low electron beam currents.

Referring to FIGS. 1(a) and 2, there is shown an electron optical system incorporated in an electron beam apparatus according to the present invention. FIG. 1(a) illustrates a mode in which a large current is directed at a specimen. FIG. 2 illustrates a mode in which a quite small current is directed at a specimen.

In FIGS. 1(a) and 2, the electron optical system has a field emission emitter 1 and an extraction electrode 2. An extraction voltage is applied between the emitter 1 and the extraction electrode 2. The electron optical system further includes an anode electrode 3. An accelerating voltage for accelerating an electron beam EB is applied between the emitter 1 and the anode electrode 3.

A first condenser lens 4 is positioned between the extraction electrode 2 and the anode electrode 3. A second condenser lens 5 is disposed beyond the anode electrode 3 moving away from the emitter. Each of these condenser lenses is made of a magnetic lens. The first condenser lens 4 may be made of an electrostatic lens.

An objective lens aperture 6 is placed beyond the second condenser lens 5 moving away from the emitter. An angular aperture control lens 7 is mounted below the lens aperture 6. An objective lens 8 is mounted beyond the angular aperture control lens 7 moving away from the emitter. The electron beam EB focused by the objective lens 8 is directed at a specimen 9.

Where the above-described electron beam apparatus is a scanning electron microscope, it is equipped with a deflector (not shown) for scanning the electron beam EB in two dimensions over the specimen 9. A secondary electron detector (not shown) is mounted close to the specimen 9 to detect secondary electrons produced from the specimen 9 by the electron beam irradiation of the specimen 9.

Where the above-described electron beam apparatus is an electron beam microanalyzer, an X-ray spectrometer (not shown) is mounted to spectrally separate characteristic X-rays produced by the electron beam irradiation of the specimen. Where the electron beam apparatus is an Auger spectrometer, an electron spectrometer is mounted to spectrally separate Auger electrons emitted from the specimen 9.

In the electron optical system shown in FIGS. 1(a) and 2, electrons are released from the emitter 1 according to the extraction voltage between the emitter 1 and the extraction electrode 2. The electrons from the emitter 1 are accelerated by the anode electrode 3 and sharply focused onto the specimen 9 by the second condenser lens 5, angular aperture control lens 7, and objective lens 8.

In the scanning electron microscope, the electron beam EB is deflected by the deflector (not shown) and scanned over the specimen 9 in two dimensions. Secondary electrons, for example, produced by the electron beam irradiation of the specimen 9 are detected by the secondary electron detector. The output signal from the detector is amplified by an amplifier (not shown) and then supplied to a signal processing circuit (not shown), where the signal is processed to adjust the contrast, brightness, etc. A video signal from the signal processing circuit is fed to a CRT 14. As a result, a secondary electron image of the specimen 9 is obtained on the CRT 14.

In the electron probe microanalyzer, characteristic X-rays produced by the electron beam irradiation of the specimen 9 are guided to an analyzer crystal. Consequently, a spectrum corresponding to the wavelengths of the characteristic X-rays is obtained. In the Auger spectrometer, Auger electrons produced by the electron beam irradiation of the specimen 9 are guided to the energy analyzer, where the Auger electrons are energy analyzed.

FIG. 1(a) illustrates a mode of operation in which the specimen 9 is irradiated with a high electron beam current. That is, in order to obtain high electron beam currents of hundreds of nano-amperes, it is necessary to collect electrons emitted by the emitter 1 as many as possible. However, electrons emitted from the emitter 1 are first cut off by the aperture of the anode electrode 3.

Figure 1B:
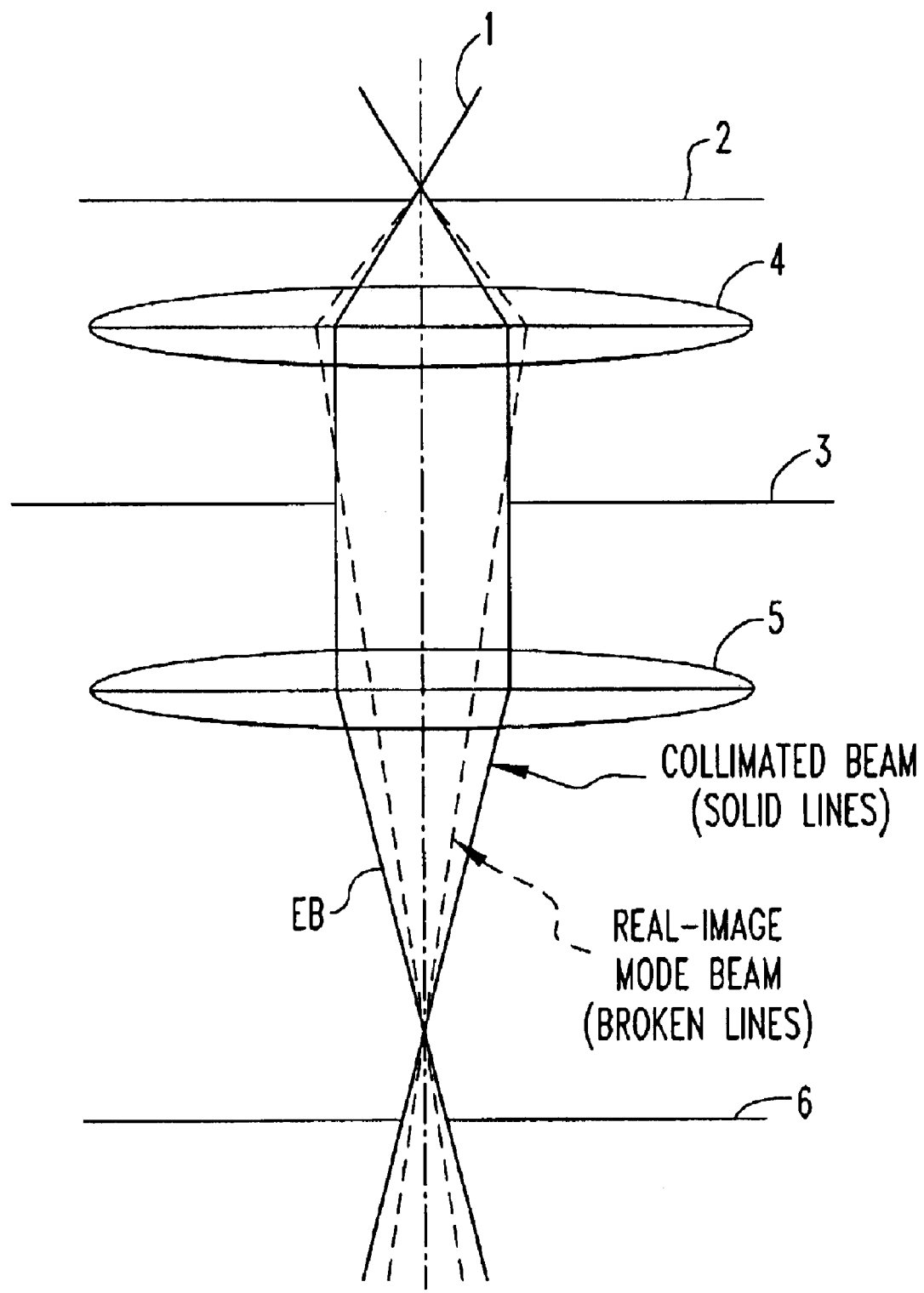
FIG. 1(b) is a ray diagram of a relevant part of the electron beam apparatus.

Therefore, in the present invention, the electron beam generated by the electron emitter 1 is collimated as indicated by the solid lines or slightly converged (is made a real-image mode beam) as indicated by the broken lines as shown in FIG. 1(b). As a result, the amount of the electron beam limited by the anode electrode 3 can be reduced to a minimum.

The collimated beam or real-image mode beam is passed through the aperture of the anode electrode 3 and converged by the second condenser lens 5. The amount of beam current incident on the specimen 9 is determined by the diameter of the objective lens aperture 6 and by the degree of focusing of the beam done by the second condenser lens 5.

The electron beam EB passed through the opening in the objective lens aperture 6 is appropriately converged by the angular aperture control lens 7 and sharply focused onto the specimen 9 by the objective lens 8. At this time, if the beam is relatively strongly converged by the control lens 7 as indicated by the solid lines in the figure, the angular aperture of the beam incident on the specimen 9 is relatively small. On the other hand, if the beam is relatively weakly converged as indicated by the broken lines, the angular aperture of the beam striking the specimen 9 is relatively large.

In the mode shown in FIG. 1(a), the electron beam emitted from the emitter 1 is collimated or made a real-image mode beam by the first condenser lens 4 in this way. Consequently, a large current is obtained. Furthermore, the aberration coefficient can be suppressed to a low level. Where the beam is collimated or made a real-image mode beam by the first condenser lens 4, the variable range of the amount of current is determined by the relation between the focal position of the second condenser lens 5 and the diameter of the objective lens aperture 6.

Therefore, where the electron beam is collimated or made a real-image mode beam by the first condenser lens 4, the variable range of the amount of current incident on the specimen 9 is determined by the angular current density of the emitter 1, the distance between the emitter 1 and the first condenser lens 4, and the distance between the second condenser lens 5 and the objective lens aperture 6. Where the distance between the emitter 1 and the first condenser lens 4 is shorter, a high electron beam current can be more easily obtained. In addition, higher resistance to external perturbations can be obtained by making the distance between the second condenser lens 5 and the objective lens aperture 6 as small as possible.

Where the distance between the second condenser lens 5 and the objective lens aperture 6 is small, it is impossible to obtain feeble currents of the order of pico-amperes even if the second condenser lens 5 is excited most strongly. In particular, if the electron beam is collimated or made a real-image mode beam by the first condenser lens 4 as shown in FIG. 1(a), and if one attempts to control the amount of current of the beam incident on the specimen only with the second condenser lens 5, the second condenser lens 5 needs a very large magnetomotive force, which is an unrealistic solution. On the other hand, where the distance between the second condenser lens 5 and the objective lens aperture 6 is increased, the height of the microscope column is increased. This reduces the resistance to external perturbations.

However, the greatest factor determining the resolution at quite low currents is aberration in the objective lens. Therefore, if the aberration coefficient of the first condenser lens 4 is increased, the resolution will not be affected.

For the above-described reasons, in the present invention, the first condenser lens 4 is deexcited at quite low currents as shown in FIG. 2. The beam current is controlled only by the second condenser lens 5. This control makes it possible to offer an optimum resolution at all times from a quite weak current region of the order of pico-amperes to a large current region of hundreds of nano-amperes. In FIG. 2, the first condenser lens 4 is fully deexcited as indicated by the broken lines. Alternatively, the lens may be kept excited quite weakly in proportion to the accelerating voltage.

Figure 3:
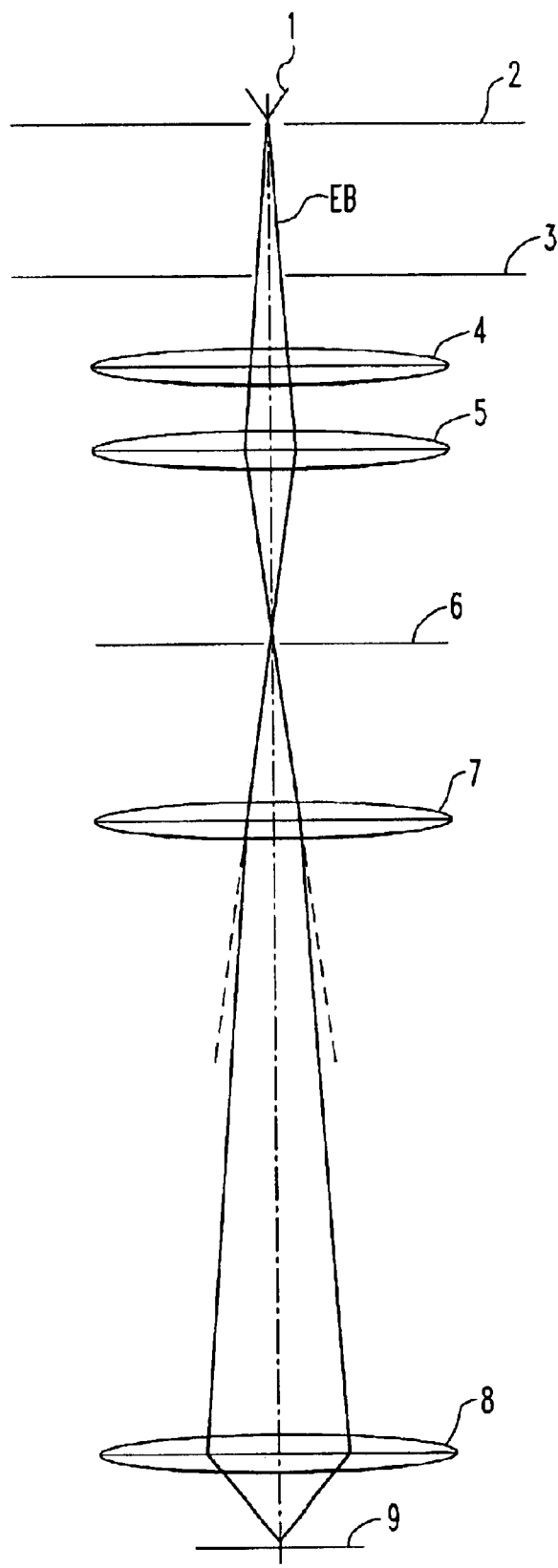
FIG. 3 is a ray diagram of another electron beam apparatus according to the present invention at high electron beam currents.
Figure 4:
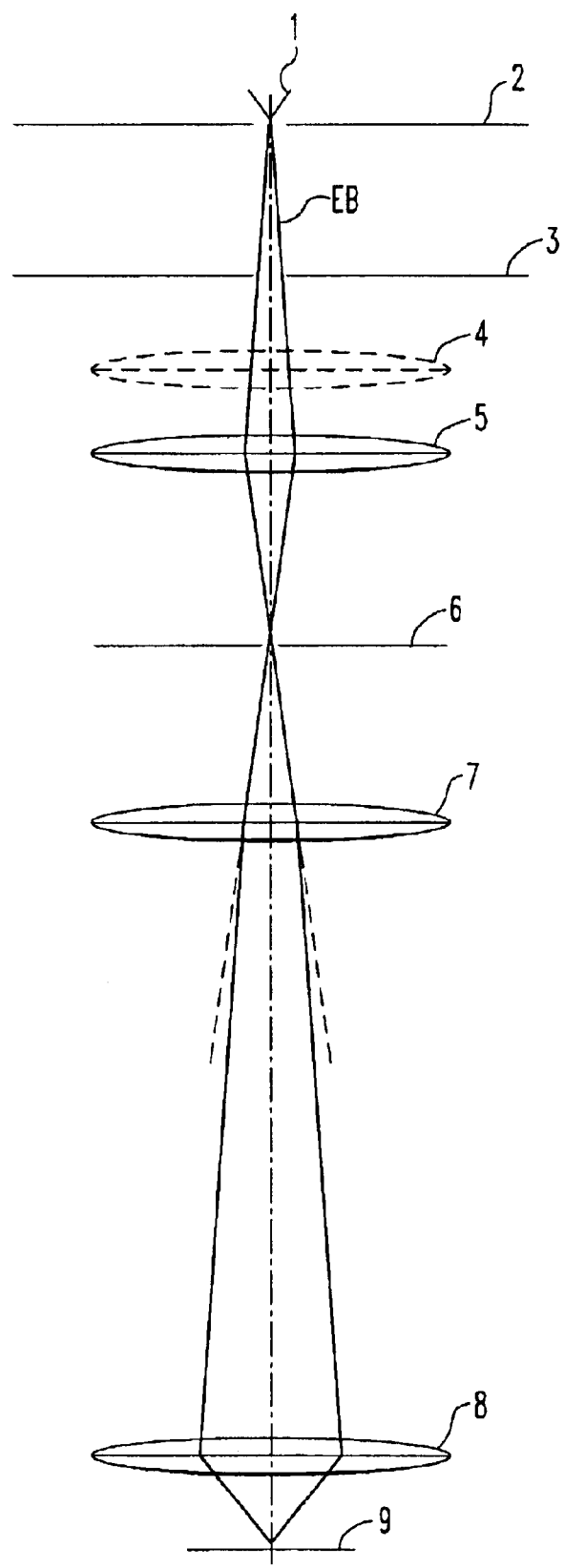
FIG. 4 is a ray diagram similar to FIG. 3, but at quite low electron beam currents.

FIGS. 3 and 4 show another embodiment of the present invention. FIG. 3 is a ray diagram at high beam currents. FIG. 4 is a ray diagram at quite low beam currents. In this embodiment, the first condenser lens 4 is placed beyond (below) the anode electrode 3. In the embodiment already described in connection with FIGS. 1(a) and 2, the principal plane of the first condenser lens 4 is placed above the anode electrode 3. This places various constraints on the structure and heat resistance of the first condenser lens 4. In the structure shown in FIGS. 3 and 4, these constraints are mitigated.

As described thus far, in the electron beam apparatus and control method according to the present invention, the electron beam from an emitter is collimated or made a real-image mode beam by the first condenser lens. Consequently, the resolution can be improved compared where the apparatus is operated conventionally in the virtual image mode.

The apparatus can be switched between a mode in which the electron beam is collimated or made a real-image mode beam by the first condenser lens and another mode in which the first condenser lens is substantially deexcited. The amount of current can be varied from a quite low beam current region to a high beam current region without at the expense of the resolution.

Having this described my invention with the detail and particularity required by the Patent Laws, what is desired protected by Letters Patent is set forth in the following claims.

The invention claimed is:

1. An electron beam apparatus comprising:
    a field emission gun having a field emission emitter, an extraction electrode for extracting electrons from said emitter to thereby extract an electron beam, and an anode electrode for accelerating said electron beam emitted from said emitter;
    a first condenser lens for collimating said electron beam extracted by said extraction electrode positioned between said extraction electrode and said anode electrode;
    a second condenser lens mounted beyond said anode electrode moving away from said emitter;
    an angular aperture control lens for controlling an angular aperture of said electron beam incident on said specimen; and
    an objective lens for focusing said electron beam onto a specimen,
    wherein said electron beam is collimated or made a real-image mode beam by said first condenser lens.

2. The electron beam apparatus of claim 1, wherein said apparatus can be switched between a mode in which the electron beam is collimated or made a real-image mode beam by said first condenser lens and another mode in which said first condenser lens is substantially deexcited.

3. The electron beam apparatus of claim 1 or 2, wherein said first condenser lens is positioned behind said anode electrode.

4. The electron beam apparatus of claim 1 or 2, wherein said first condenser lens is a magnetic lens.

5. The electron beam apparatus of claim 1 or 2, wherein said first condenser lens is an electrostatic lens.

6. A method of controlling an electron beam apparatus having (a) a field emission gun having a field emission emitter, an extraction electrode for extracting electrons from said emitter, and an anode electrode for accelerating said electron beam emitted from said emitter; (b) a first condenser lens for collimating said electron beam extracted by said extraction electrode positioned between said extraction electrode and said anode electrode; (c) a second condenser lens mounted behind said anode electrode; (d) an objective lens for focusing said electron beam onto a specimen; and (e) an angular aperture control lens for controlling an angular aperture of said beam incident on said specimen, said method comprising the step of:
    collimating said electron beam or making the beam a real-image mode beam by said first condenser lens.

7. The method of claim 6, wherein said electron beam apparatus can be switched between a mode in which said electron beam is collimated or made a real-image mode beam by said first condenser lens and another mode in which said first condenser lens is substantially deexcited.

* * * * *